United States Patent [19]

Yabu et al.

[11] Patent Number: 4,583,840

[45] Date of Patent: Apr. 22, 1986

[54] EXPOSURE APPARATUS

[75] Inventors: Syuichi Yabu, Kawasaki; Hiroshi Sato, Tokyo, both of Japan

[73] Assignee: Canon Kabushiki Kaisha, Tokyo, Japan

[21] Appl. No.: 553,129

[22] Filed: Nov. 18, 1983

[30] Foreign Application Priority Data

Nov. 29, 1982 [JP] Japan .................................. 57-208766

[51] Int. Cl.⁴ .............................................. G03B 27/52
[52] U.S. Cl. ....................................... 355/30; 355/53; 355/55; 355/67
[58] Field of Search ........................ 355/30, 55, 56, 43, 355/45, 53, 67

[56] References Cited

U.S. PATENT DOCUMENTS

| 4,202,623 | 5/1980 | Watkin | 355/30 |
| 4,432,635 | 2/1984 | Mayer | 355/30 |
| 4,496,239 | 1/1985 | Isohata et al. | 355/30 |
| 4,503,335 | 3/1985 | Takahashi et al. | 355/30 X |

Primary Examiner—Richard A. Wintercorn
Attorney, Agent, or Firm—Fitzpatrick, Cella, Harper & Scinto

[57] ABSTRACT

An exposure apparatus includes an original stage for holding an original, a stage holding and moving a radiation sensitive member, a projection optical system for projecting the image of the original onto the radiation sensitive member, a device for illuminating the original, and a device for supplying heat to the projection optical system to maintain the imaging position of the projection optical system when no exposure operation is effected.

19 Claims, 5 Drawing Figures

EXPOSURE APPARATUS

BACKGROUND OF THE INVENTION

1. Field of the Invention

The present invention relates to a semiconductor printing and exposing system for maintaining a stable exposure performance in a projection optical system and a method for controlling the same.

2. Description of the Prior Art

Recently, the patterns of semiconductors such as so-called IC, LSI, VLSI and others are increasingly miniaturized and integrated. The width of line in these patterns is now being decreased to the range of one to two µm. Such miniaturization and integration require an exposure apparatus which has an exposure performance capable of printing finer patterns with the width of line in the range of one to two µm and an alignment performance capable of accurately aligning the patterns with one another through a plurality of steps and which can provide wafers having no defects. In order to satisfy these requirements, various types of projection and exposure systems are energetically being developed.

In such projection and exposure systems, a projection optical system has its depth of focus usually in the order of ±1–2 µm depending on the relationship between the effective F-number and the wavelength used therein. For this reason, the projection and exposure system should have a focusing mechanism for exactly imaging the pattern of a photo-mask on the surface of a wafer. In addition, the projection optical system must inherently have its error of magnification and its distortion, but these have to be maintained less than the accuracy of alignment which is required to be in the order of ±0.3 µm for aligning the finer patterns with one another. When the wafer is subjected to exposure operation, the projection optical system is increased in temperature by absorbing part of the heat energy from the light of exposure. As a result, the projection optical system changes in its optical performances to vary or displace its optimum image position. Thus, the magnification and distortion of the projection optical system will unavoidably be affected adversely by the variations of the optical performance.

FIG. 1 illustrates the time chart showing illumination system in the prior art system and also displacements Δx of the imaging position in the projection optical system thereof. As shown in FIG. 1, the exposure process consisting of a series of exposure steps is initiated at Time T1 and then terminated at Time T3. During a period from T3 to T4, the exposed wafer is brought out and then a new wafer is brought in. Supposing that the optimum image position of the projection optical system is the saturated position in the displacement Δx, the imaging position is gradually increased from Time T1 at which the exposure process is initiated and reaches the optimum imaging position at Time T2. During the period between T3 and T4 for which no exposure is effected, however, the displacement Δx returns to its original state. In the prior art, thus, the projection optical system thereof is changed in its performances during the entire process, leading to the fault of its focusing function and the decrease of its alignment accuracy.

SUMMARY OF THE INVENTION

It is the principal object of the present invention to eliminate the above disadvantages in the prior art and to provide an exposure apparatus, more particularly, a semiconductor alignment and exposure apparatus which can maintain a projection optical system at a constant state in the optimum imaging position to provide its stable focusing function, alignment performance and exposure performance at least during the exposure process.

These and other objects, features and advantages of the present invention will become more apparent upon a consideration of the following description of the preferred embodiment of the present invention taken in conjunction with the accompanying drawings.

DESCRIPTION OF THE PREFERRED EMBODIMENTS

Figure 1:
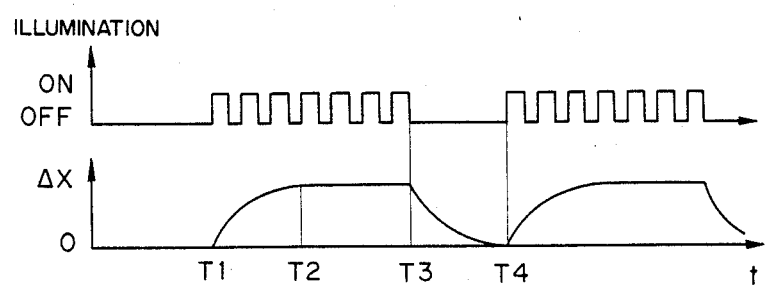
FIG. 1 is a graphic diagram showing the timing chart of illumination and displacements Δx of the image position in the prior art projection optical system.
Figure 2:
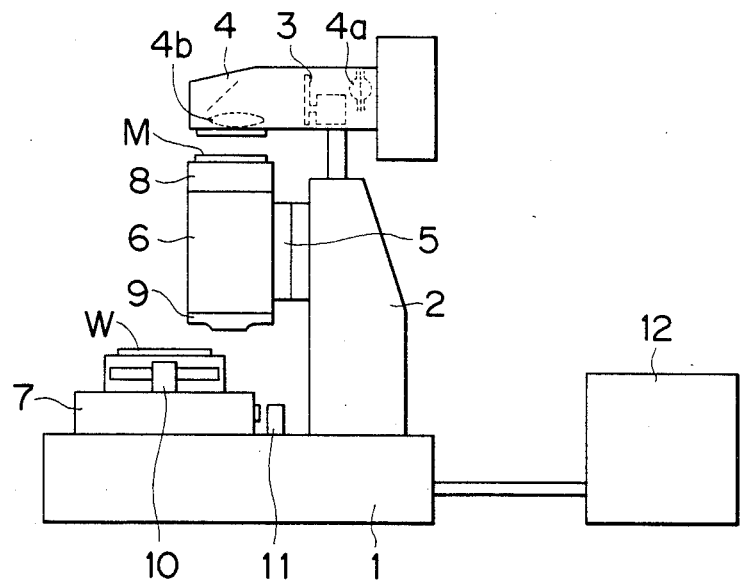
FIG. 2 is a schematic diagram of an exposure apparatus according to the present invention.

Referring to FIG. 2, there is shown a die-by-die (shot by shot) alignment and exposure apparatus according to the present invention in which the pattern on a photo-mask M is projected onto a wafer W in the die-by-die exposure manner. The apparatus comprises a base table 1 having a column 2 supported thereon, an illumination system 4 located on the top of the column 2 for emitting an illumination light and containing a shutter 3, a source of light 4a and a condenser lens 4b, a projection optical system 6 consisting of reduction lenses, the system being connected with the column 2 through a focusing mechanism 5. Below the projection optical system 6, an X-Y stage 7 is placed on the base table 1 and adapted to move the wafer W which is placed on the X-Y stage 7. On the top of the projection optical system 6, there is mounted a photo-mask stage 8 on which the photo-mask M is set. The projection optical system 6 is provided with a bottom opening near which a sensor 9 for measuring the spacing between the projection optical system 6 and the wafer W is mounted. The apparatus also comprises sensors 10 and 11 for detecting the positions of the X-Y stage 7 in the X-direction and Y-direction, respectively, and a control 12 for controlling the shutter 3, the focusing mechanism 5 and the X-Y stage 7.

The projection and exposure apparatus shown in FIG. 2 is substantially similar to that of the prior art except for the control 12. In the illustrated embodiment, the control 12 controls the illumination system 4 to emit the illumination light therefrom other than in the exposure process, as seen from FIG. 3. For example, the illumination system 4 is repeatedly energized as in the exposure process to provide the heat energy of the illumination light to the projection optical system 6 such that the amount of heat energy per unit time will substantially be equal to that throughout the exposure process. The non-exposure process mainly provides time required to bring wafers in and out of the stage. During this non-exposure process, any wafer W should not be exposed to the illumination light.

With experiments, it has been found that the projection optical system 6 can be maintained at the constant optical performances if the ratio of te/tp is constant, where the exposure time is te and the interval or period of exposure cycles is tp. In the present embodiment, time Ts required for the projection optical system 6 to reach its saturated or optimum state is preliminarily stored in the control 12. Prior to the energization of the apparatus, the first exposure time te and the interval tp of the die-by-die exposure are given to the input of the control 12. When the apparatus is started, the control 12 verifies the wafer W located out of the exposure position, based on signals from the sensor 10 and 11 and then supplies a drive signal to the shutter 3. The shutter 3 is controlled to have the first open time to and closed time tc represented by the following relation-ship:

$$to/(to+tc)=te/tp \ldots \quad (1)$$

During the time Ts, the shutter 3 continues to repeatedly open and close in accordance with the command from the control 12 so that the projection optical system 6 will be placed and maintained at its saturated and therefore stable state. After the time Ts, the wafer W is moved to the exposure position by means of the X-Y stage 7. The stepping exposure process is repeated. The stepping exposure process is carried out under the preset time schedule such that the projection optical system 6 will be subjected to such a heat energy that the displacement $\Delta x$ is maintained at its saturated optical performances, when a wafer W has completely been exposed, it is removed from the stage and then a new wafer is placed on the stage. During this operation, the control 12 continues or verifies that no wafer is located on the exposure position based on signals from the sensors 10 and 11 and then supplies a drive signal to the shutter 3 which signal satisfies the formula (1). As a result, the projection optical system 6 will have its displacement $\Delta x$ which is maintained constant. Even in the non-exposure process, the shutter 3 is continuously opened and closed under the relationship represented by the formula (1) so that the projection optical system 6 will be maintained at its saturated or optimum optical performance.

Figure 4:
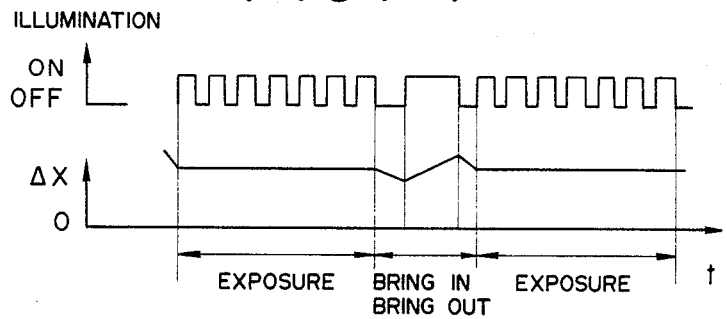

FIG. 4 shows another embodiment of the present invention in which, in the non-exposure process, the projection optical system 6 is subjected temporarily to heat energy under the action of the control 12 to facilitate the removal and charge of wafer W. The displacement $\Delta x$ of the image position of the projection optical system 6 is over-increased to a predetermined value, and then the illumination is stopped. Thereafter, heat is exhausted from the projection optical system 6 while a new wafer W is being placed in the apparatus. When the displacement $\Delta x$ in the projection optical system 6 restores its optimum state for exposure, this new wafer W is initiated to expose to the illumination light.

Figure 5:
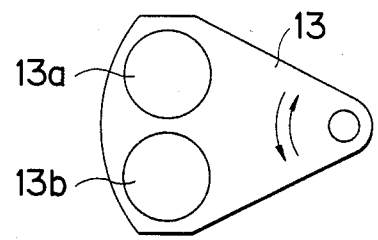
FIG. 5 is a plan view of a modification of a shutter.

FIG. 5 shows a filter disc 3 of the apparatus shown in FIG. 2 located near the shutter 3. The filter disc 13 includes a filter 13a for permitting a light in a wavelength range suitable for the exposure process to be transmitted therethrough, and a filter 13b for absorbing or reflecting the exposure light and for permitting a light in a wavelength range to which the wafer W is not sensitive to be transmitted therethrough. In accordance with signals from the control 12, the filter disc 13 is swung as shown by arrows. In the exposure process, the exposure light can be transmitted through the filter 13a to illuminate the wafer. In the non-exposure process, the non-exposure light is transmitted through the filter 13b.

Figure 3:
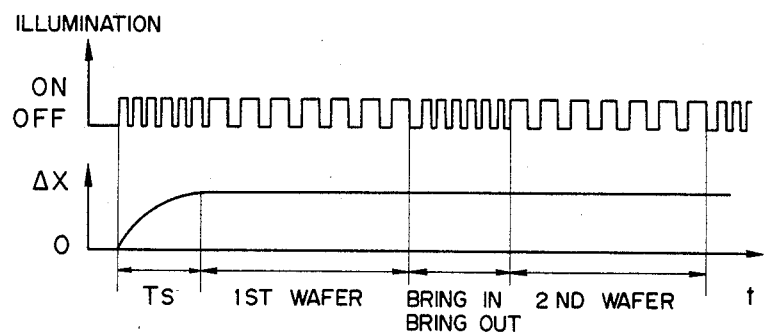
FIGS. 3 and 4 are graphic diagrams showing the timing charts of illumination and displacements Δx of the image position in the projection optical system according to the present invention.

If the performances of these filters 13a and 13b are so selected that heat energy absorbed by the projection optical system 6 per a unit time when such an exposure light as shown in FIG. 3 is irradiated may be equal to that absorbed by the projection optical system 6 when a non-exposure light is irradiated, the projection optical system always absorbs a constant heat energy so that the saturated state can be maintained. This is accomplished by changing these filters 13a and 13b in transmittance, for example. Where the filters 13a and 13b are used, the illumination may continuously be carried out rather than the discontinuous illumination in the non-exposure process. In any event, the wafer W will not be exposed to any exposure light.

The irradiation of the non-exposure light can be clearly distinguished from the irradiation in the alignment operation. For the reduction projection lens, it is extremely difficult to compensate chromatic aberration both for the exposure and non-exposure lights. Therefore, the non-exposure light is not used in the alignment operation.

As will be understood from the above description, the semiconductor exposure apparatus according to the present invention can maintain the projection optical system at its constant optical performances throughout the exposure process by illuminating the projection optical system in the non-exposure process. Therefore, the projection optical system can be stabilized in focusing function, alignment performances and exposure performances to effect the exposure process with higher accuracy.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   first holder means for holding an original;
   second holder means for holding a radiation sensitive member;
   a projection system for projecting an image of said original onto said radiation sensitive member;
   illumination means for illuminating said original with an illumination energy to expose said radiation sensitive member to the image of said original through said projection system; and
   means for supplying heat, during the time of no image exposure being effected, to said projection system to maintain its imaging position.

2. An exposure apparatus as defined in claim 1 wherein said supplying means irradiates said projection system with an illumination energy to which said radiation sensitive member is sensitive.

3. An exposure apparatus as defined in claim 2 wherein said supplying means irradiates the illumination energy intermittently.

4. An exposure apparatus as defined in claim 1 wherein said supplying means includes a shutter for blocking the illumination energy and control means for controlling said shutter with respect to its opening and closing during the time of no image exposure being effected.

5. An exposure apparatus as defined in claim 1 wherein said supplying means irradiates said projection system with an illumination energy to which said radiation sensitive member is insensitive.

6. An exposure apparatus as defined in claim 5 wherein said supplying means includes means for selecting one of the illumination energy to which said radiation sensitive member is sensitive and the illumination energy to which said radiation sensitive member is insensitive.

7. An exposure apparatus as defined in claim 6 wherein said selecting means includes filters different from each other in transmissive wavelength range.

8. An exposure apparatus comprising:
a mask stage for holding a mask;
a wafer stage for holding and steppingly moving a wafer;
a projection optical system for projecting the image of said mask onto said wafer;
illumination means for illuminating said mask; and
means for operating said illumination means to maintain an imaging position of said projection optical system for a period from a first stepped exposure process to a second stepped exposure process.

9. An exposure apparatus as defined in claim 8 wherein said operating means operates said illumination means when the wafer is not positioned within the region in which the image of said mask is formed.

10. An exposure apparatus as defined in claim 8 wherein said operating means operates said illumination means intermittently.

11. An exposure apparatus as defined in claim 8 wherein said operating means irradiates said projection optical system with the light, from said illumination means, to which said wafer is sensitive.

12. An exposure apparatus as defined in claim 8 wherein said operating means irradiates said projection optical system with the light, from said illumination means, to which said wafer is insensitive.

13. An exposure apparatus as defined in claim 12 wherein said illumination means includes filters different from each other in transmissive wavelength range, said filters being selectively used.

14. An exposure apparatus as defined in claim 8 wherein said projection optical system is a reduction-projection lens.

15. An exposure apparatus, comprising:
means for projecting an image of a first object on to a second object;
means for illuminating the first object so that the image of the first object is transferred onto the second object through said projecting means; and
means for supplying heat, during the time that no image transfer is being effected, to said projecting means to prevent any change in an imaging position thereof at the time of image transfer.

16. An apparatus according to claim 15, wherein said heat supplying means supplies the heat to said projecting means during the time of replacement of the second object.

17. An apparatus according to claim 16, wherein said illuminating means is operative to illuminate the first object after each stepwise movement of the second object relative to the image of the first object.

18. An apparatus according to claim 17, wherein said heat supplying means is operative to supply, during the replacement of the second object, heat to said projecting means by an amount which is substantially equal, per a unit of time, to that of the heat supplied to said projecting means by the illumination of the first object.

19. An apparatus according to claim 18, wherein said heat supplying means supplies the heat to said projecting means through said illuminating means.

* * * * *